United States Patent
Hayashi et al.

(10) Patent No.: US 12,255,081 B2
(45) Date of Patent: Mar. 18, 2025

(54) SUBSTRATE PROCESSING APPARATUS AND SUBSTRATE PROCESSING METHOD

(71) Applicant: Tokyo Electron Limited, Tokyo (JP)

(72) Inventors: Shinichi Hayashi, Koshi (JP); Hiroaki Inadomi, Koshi (JP); Shota Umezaki, Koshi (JP); Suguru Enokida, Koshi (JP); Kouji Kimoto, Koshi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 46 days.

(21) Appl. No.: 17/657,821

(22) Filed: Apr. 4, 2022

(65) Prior Publication Data

US 2022/0319876 A1   Oct. 6, 2022

(30) Foreign Application Priority Data

Apr. 5, 2021 (JP) ................. 2021-063884

(51) Int. Cl.
| | |
|---|---|
| *H01L 21/67* | (2006.01) |
| *B08B 3/08* | (2006.01) |
| *B08B 13/00* | (2006.01) |
| *H01L 21/02* | (2006.01) |
| *H01L 21/677* | (2006.01) |

(52) U.S. Cl.
CPC .......... *H01L 21/67034* (2013.01); *B08B 3/08* (2013.01); *B08B 13/00* (2013.01); *H01L 21/02057* (2013.01); *H01L 21/67754* (2013.01)

(58) Field of Classification Search
CPC ......... H01L 21/67034; H01L 21/02057; H01L 21/67754; B08B 3/08; B08B 13/00

USPC ........................................... 134/61
See application file for complete search history.

(56) References Cited

U.S. PATENT DOCUMENTS

2008/0202687 A1* 8/2008 Smith ............... H01L 21/67178
                                                   156/345.32
2010/0215461 A1* 8/2010 Kamikawa ........ H01L 21/67727
                                                   414/222.13

FOREIGN PATENT DOCUMENTS

| JP | 2013-080908 A | 5/2013 |
| JP | 2018-081966 A | 5/2018 |

OTHER PUBLICATIONS

JP2018081966A—machine translation (Year: 2018).*

* cited by examiner

*Primary Examiner* — Tinsae B Ayalew
(74) *Attorney, Agent, or Firm* — Chrisman Gallo Tochtrop LLC

(57) ABSTRACT

A substrate processing apparatus includes multiple first substrate processing devices, one or more second substrate processing devices and a transfer unit. Each of the multiple first substrate processing devices is configured to process a substrate one by one. The one or more second substrate processing devices are configured to simultaneously process multiple substrates, which are processed in the multiple first substrate processing devices. The transfer unit is configured to simultaneously carry the multiple substrates, which are processed in the multiple first substrate processing devices, into a same second substrate processing device.

10 Claims, 20 Drawing Sheets

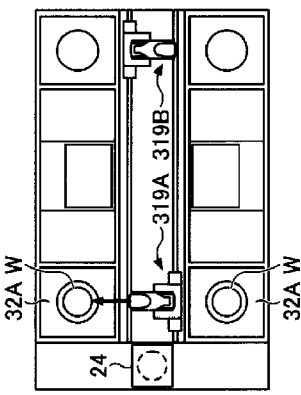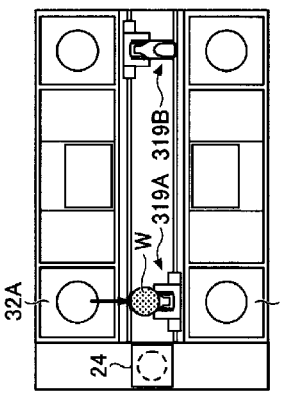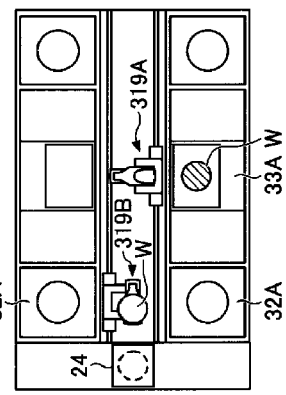
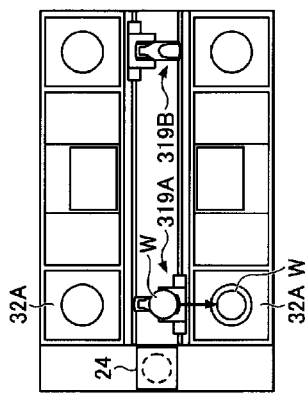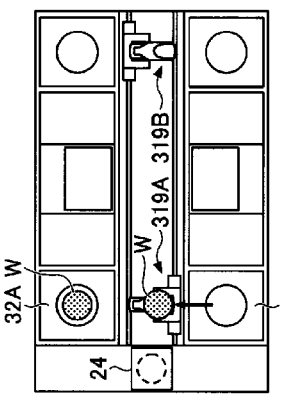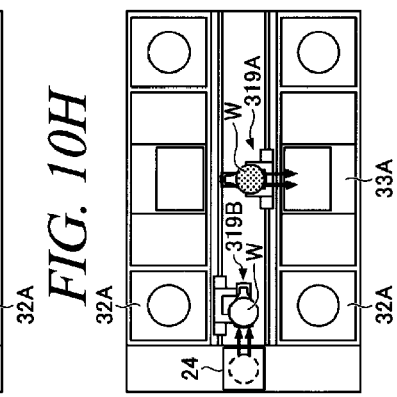
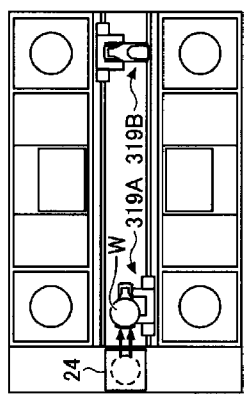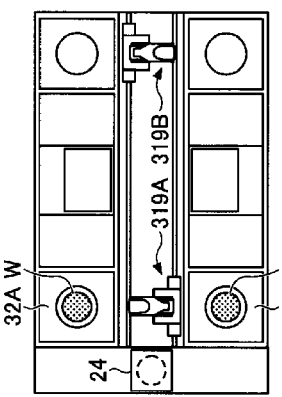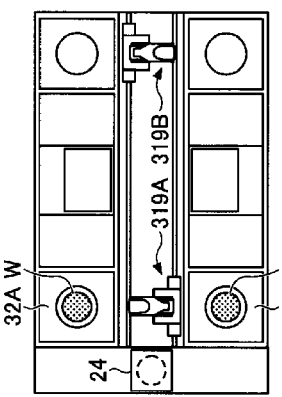

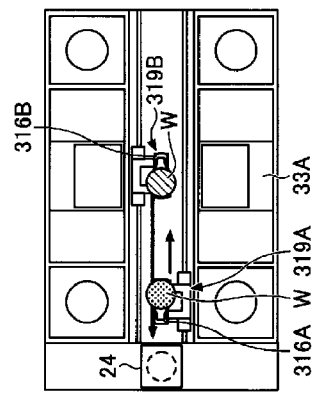
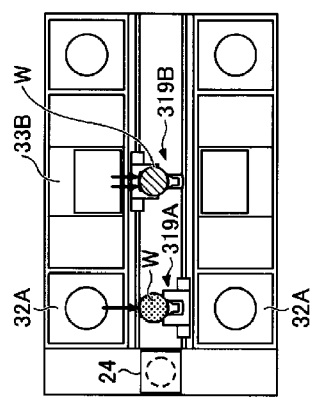
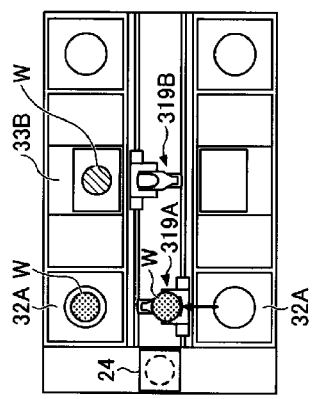
FIG. 12A
FIG. 12B
FIG. 12C

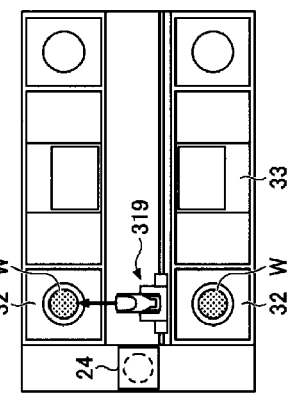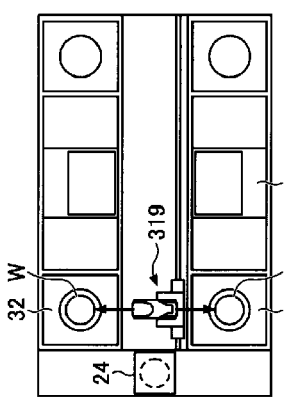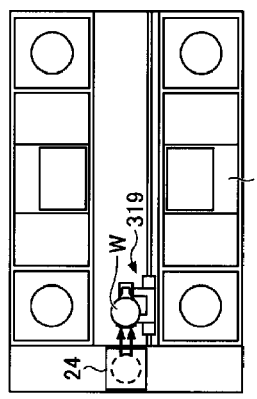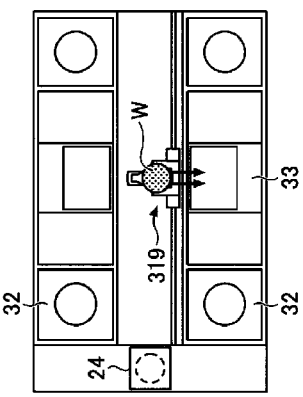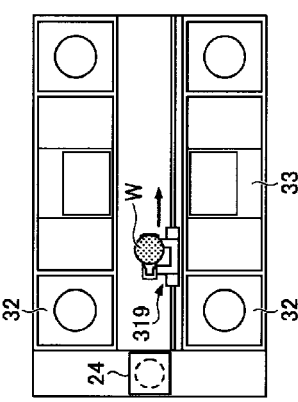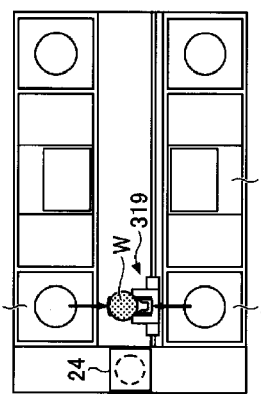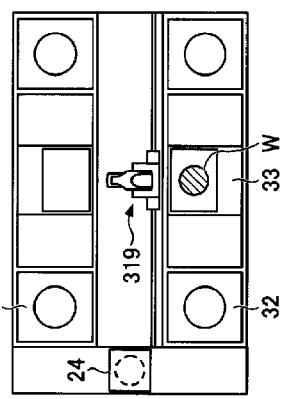

SUBSTRATE PROCESSING APPARATUS AND SUBSTRATE PROCESSING METHOD

CROSS-REFERENCE TO RELATED APPLICATION

This application claims the benefit of Japanese Patent Application No. 2021-063884 filed on Apr. 5, 2021, the entire disclosure of which is incorporated herein by reference.

TECHNICAL FIELD

The exemplary embodiments described herein pertain generally to a substrate processing apparatus and a substrate processing method.

BACKGROUND

A substrate processing system described in Patent Document 1 includes a plurality of cleaning apparatuses that performs a cleaning processing by supplying a cleaning liquid to a wafer, and a plurality of supercritical processing apparatuses that removes an anti-drying liquid (for example, IPA) remaining on the wafer after the cleaning processing by bringing the anti-drying liquid into contact with a supercritical processing liquid (for example, carbon dioxide).

Patent Document 1: Japanese Patent Laid-open Publication No. 2018-081966

SUMMARY

In one exemplary embodiment, a substrate processing apparatus includes multiple first substrate processing devices, one or more second substrate processing devices and a transfer unit. Each of the multiple first substrate processing devices is configured to process a substrate one by one. The one or more second substrate processing devices are configured to simultaneously process multiple substrates, which are processed in the multiple first substrate processing devices. The transfer unit is configured to simultaneously carry the multiple substrates, which are processed in the multiple first substrate processing devices, into a same second substrate processing device.

The foregoing summary is illustrative only and is not intended to be in any way limiting. In addition to the illustrative aspects, exemplary embodiments, and features described above, further aspects, exemplary embodiments, and features will become apparent by reference to the drawings and the following detailed description.

BRIEF DESCRIPTION OF THE DRAWINGS

In the detailed description that follows, exemplary embodiments are described as illustrations only since various changes and modifications will become apparent to those skilled in the art from the following detailed description. The use of the same reference numerals in different figures indicates similar or identical items.

FIG. 6A to FIG. 6I are plan views sequentially illustrating a plurality of processes;

FIG. 10A to FIG. 10I show plan views illustrating operations of the substrate processing apparatus according to the first modification example, and FIG. 10A to FIG. 10I are plan views sequentially illustrating a plurality of processes;

FIG. 12A to FIG. 12C show plan views illustrating operations of the substrate processing apparatus according to the first modification example subsequent to FIG. 11A to FIG. 11I, and FIG. 12A to FIG. 12C are plan views sequentially illustrating a plurality of processes;

FIG. 13A to FIG. 13G show plan views illustrating operations of the substrate processing apparatus according to a second modification example, and FIG. 13A to FIG. 13G are plan views sequentially illustrating a plurality of processes;

FIG. 15A to FIG. 15F are plan views sequentially illustrating a plurality of processes;

DETAILED DESCRIPTION

Figure 1:
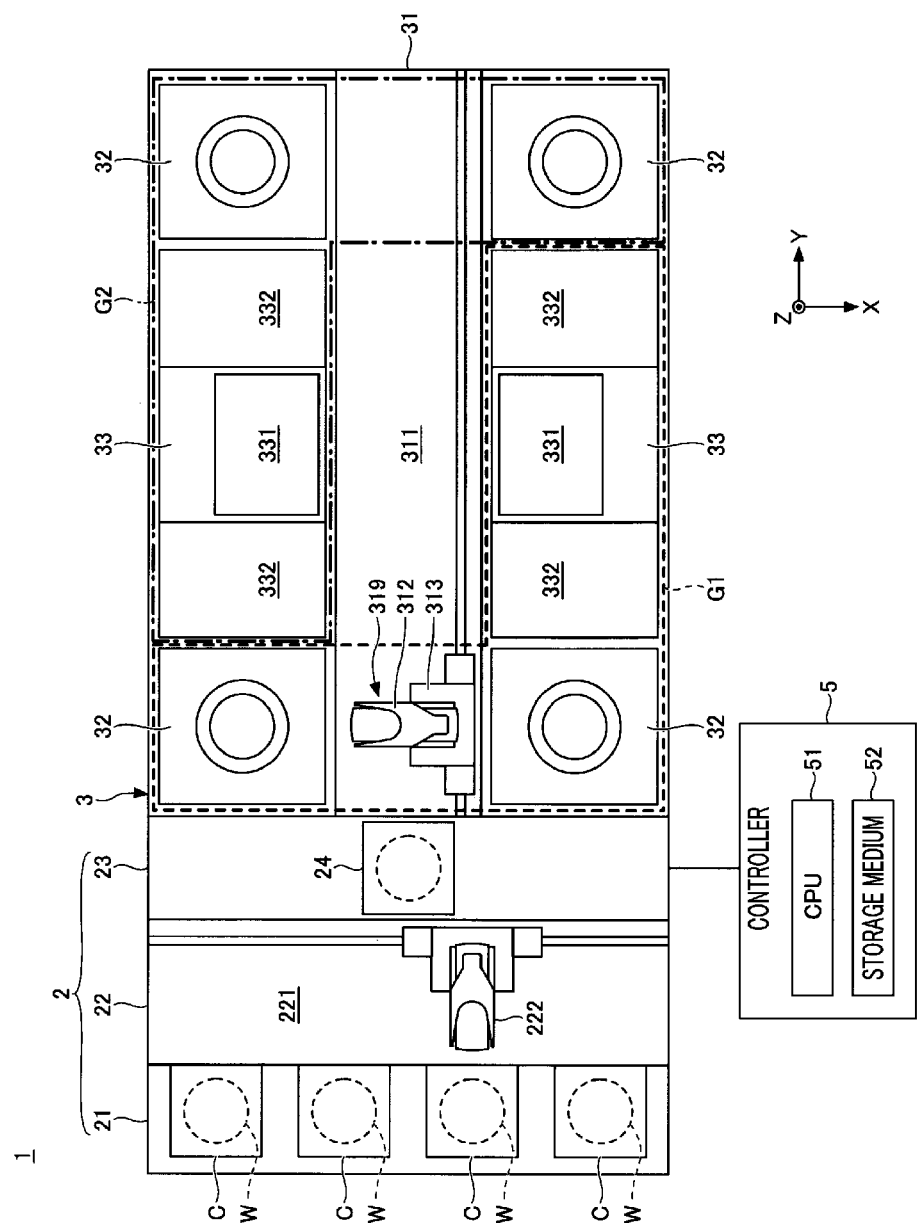
FIG. 1 is a plan view of a substrate processing apparatus according to an exemplary embodiment.

In the following detailed description, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current exemplary embodiment. Still, the exemplary embodiments described in the detailed description, drawings, and claims are not meant to be limiting. Other exemplary embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein.

Hereinafter, exemplary embodiments of the present disclosure will be described with reference to the accompanying drawings. In the drawings, same parts will be assigned same reference numerals, and redundant description may be omitted. In the present disclosure, an X-axis direction, a Y-axis direction and a Z-axis direction are orthogonal to one another. The X-axis direction and the Y-axis direction are horizontal directions, and the Z-axis direction is a vertical direction.

Figure 2:
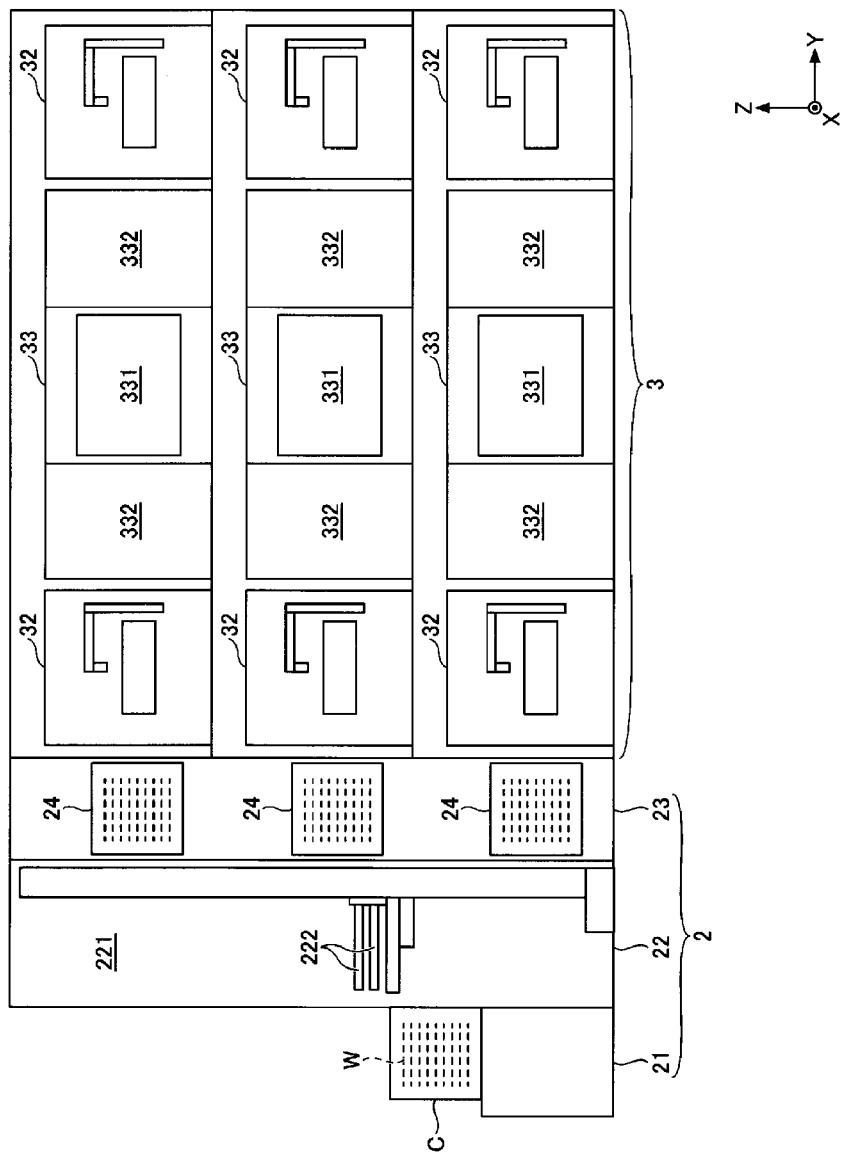
FIG. 2 is a front view of the substrate processing apparatus according to the exemplary embodiment.

First, a substrate processing apparatus 1 according to an exemplary embodiment will be described with reference to FIG. 1 to FIG. 3. As shown in FIG. 1, the substrate processing apparatus 1 is equipped with a carry-in/out station 2 and a processing station 3. The carry-in/out station 2 and the processing station 3 are provided adjacent to each other in the Y-axis direction.

The carry-in/out station 2 is equipped with a carrier placing unit 21, a second transfer unit 22 and a delivery unit 23. Carriers C are placed in the carrier placing unit 21. Each carrier C accommodates therein a plurality of substrates W. The plurality of substrates W are arranged at intervals in a vertical direction inside the carrier C, and each is accommodated horizontally.

The substrate W may include a semiconductor substrate such as a silicon wafer or a compound semiconductor wafer, or a glass substrate. The substrate W may further include a device such as an electronic circuit formed on the surface of the semiconductor substrate or glass substrate. The substrate W may have an uneven pattern on its surface.

The second transfer unit 22 is provided adjacent to the carrier placing unit 21 and configured to carry the substrate W out of the carrier C. The second transfer unit 22 has a transfer path 221 extending in the X-axis direction and a support 222 configured to support the substrate W. For example, the support 222 has a fork shape. The support 222 is movable horizontally (in both the X-axis direction and the Y-axis direction) and vertically, and pivotable around a vertical axis. The number of supports 222 may be one or may be more than one.

The delivery unit 23 is provided adjacent to the second transfer unit 22 and configured to receive the substrate W delivered by the second transfer unit 22. The delivery unit 23 has a transit device 24 in which a plurality of substrates W is placed. As shown in FIG. 2, a plurality of transit devices 24 may be stacked in the vertical direction. However, the arrangement and the number of transit devices 24 are not limited particularly.

The processing station 3 is equipped with a first transfer unit 31, a liquid processing device 32 and a drying device 33. As shown in FIG. 2, a plurality of liquid processing devices 32 may be stacked in the vertical direction. Likewise, a plurality of drying devices 33 may be stacked in the vertical direction. Also, as shown in FIG. 3, a plurality of first transfer units 31 may be stacked in the vertical direction. The first transfer unit 31 transfers the substrate W among the devices (for example, the transit device 24, the liquid processing device 32 and the drying device 33) corresponding to the first transfer unit 31.

The first transfer unit 31 has a transfer path 311 extending in the Y-axis direction and a support 312 configured to support the substrate W. For example, the support 312 has a fork shape. The support 312 is movable horizontally (in both the X-axis direction and the Y-axis direction) and vertically, and pivotable around a vertical axis. The number of supports 312 is more than one (for example, two).

The liquid processing device 32 is configured to process a surface of the substrate W with a processing liquid. The liquid processing device 32 includes, for example, a spin chuck configured to horizontally support the substrate W and a nozzle configured to discharge the processing liquid onto a top surface of the substrate W. The nozzle is configured to supply the processing liquid to the center of the top surface of the substrate W being rotated. The processing liquid is diffused from a center of the top surface of the substrate W toward a periphery thereof by centrifugal force. As the processing liquid, for example, a chemical liquid, a rinsing liquid and a drying liquid are supplied in this order. A plurality of kinds of chemical liquids may be supplied, or a rinsing liquid may be supplied between the supply of one chemical liquid and the supply of another chemical liquid. The liquid processing device 32 may include a moving mechanism configured to move the nozzle in a diametrical direction of the substrate W.

For example, the liquid processing device 32 forms a liquid film of a chemical liquid on the horizontal top surface of the substrate W, replaces the liquid film of the chemical liquid with a liquid film of a rinsing liquid and then replaces the liquid film of the rinsing liquid with a liquid film of a drying liquid. The chemical liquid may be, for example, SC1 (aqueous solution of ammonia and hydrogen peroxide), DHF (diluted hydrofluoric acid) or SPM (sulfuric acid-hydrogen peroxide mixture). The rinsing liquid may be, for example, DIW (deionized water), diluted ammonia solution or ozone water. The drying liquid may be, for example, an organic solvent such as IPA (isopropyl alcohol).

For example, the drying device 33 is configured to dry the substrate W by replacing the drying liquid accumulated on the substrate W with a supercritical fluid. The supercritical fluid is a fluid at a critical temperature or more and a critical pressure or more, and does not have distinct liquid and gas phases. If the drying liquid is replaced with the supercritical fluid, it is possible to suppress formation of an interface between a liquid and a gas in the uneven pattern of the substrate W. As a result, it is possible to suppress generation of surface tension and thus possible to suppress the collapse of the uneven pattern. The drying device 33 is equipped with a processing container 331 and a supply mechanism 332.

The supply mechanism 332 is configured to supply the fluid into the processing container 331. Specifically, the supply mechanism 332 is equipped with a supply device group including a flowmeter, a flow rate controller, a back pressure valve, a heater, and the like, and a housing accommodating therein the supply device group. The supply mechanism 332 supplies, for example, $CO_2$ as the fluid into the processing container 331. The supply mechanism 332 may also serve as a drain mechanism configured to drain the fluid from the processing container 331. The supply mechanism 332 may be divided into two with the processing container 331 arranged therebetween, as shown in FIG. 1. In a plurality of groups G1 and G2 to be described later, substrates W can be transferred at the same time.

The substrate processing apparatus 1 is equipped with a controller 5. The controller 5 may be, for example, a computer, and may include a CPU (Central Processing Unit) 51 and a storage medium 52 such as a memory. A program for controlling various processings performed in the substrate processing apparatus 1 is stored in the storage medium 52. The controller 5 controls operations of the substrate processing apparatus 1 by allowing the CPU 51 to execute the program stored in the storage medium 52.

Figure 4:
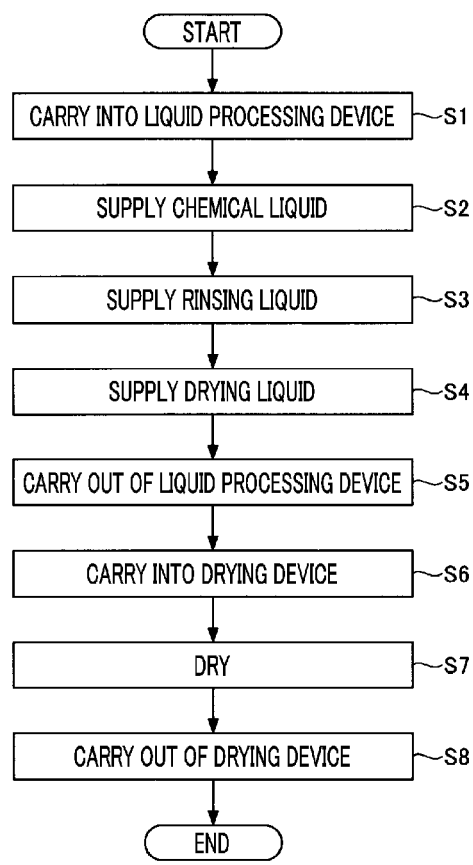
FIG. 4 is a flowchart showing a substrate processing method according to the exemplary embodiment.

Hereinafter, a substrate processing method according to the exemplary embodiment will be described with reference to FIG. 4. The substrate processing method includes, for example, processes S1 to S8. The processes S1 to S8 are performed under the control of the controller 5.

First, the second transfer unit 22 takes the substrate W out of the carrier C and transfers the substrate W to the transit device 24. Thereafter, the first transfer unit 31 takes the substrate W out of the transit device 24 and then carries the substrate W into the liquid processing device 32 (S1).

Subsequently, the liquid processing device 32 supplies the chemical liquid to the horizontal top surface of the substrate W (S2). The chemical liquid is supplied to the center of the top surface of the substrate W being rotated and spreads over the entire top surface in the diametrical direction by the centrifugal force to form the liquid film.

Then, the liquid processing device 32 supplies the rinsing liquid to the horizontal top surface of the substrate W (S3). The rinsing liquid is supplied to the center of the top surface of the substrate W being rotated and spreads over the entire top surface in the diametrical direction by the centrifugal force to form the liquid film. The liquid film of the chemical liquid is replaced with the liquid film of the rinsing liquid.

Thereafter, the liquid processing device 32 supplies the drying liquid to the horizontal top surface of the substrate W (S4). The drying liquid is supplied to the center of the top surface of the substrate W being rotated and spreads over the entire top surface in the diametrical direction by the centrifugal force to form the liquid film. The liquid film of the rinsing liquid is replaced with the liquid film of the drying liquid.

Subsequently, the first transfer unit 31 carries the substrate W out of the liquid processing device 32 (S5) and then carries the substrate W into the drying device 33 (S6). The first transfer unit 31 transfers the substrate W from the liquid processing device 32 into the drying device 33 in a state where the drying liquid is accumulated on the substrate W. The first transfer unit 31 horizontally supports the substrate W.

Then, the drying device 33 dries the substrate W by replacing the drying liquid accumulated on the substrate W with the supercritical fluid (S7). If the drying liquid is replaced with the supercritical fluid, it is possible to suppress the formation of the interface between the liquid and the gas in the uneven pattern of the substrate W. As a result, it is possible to suppress the generation of the surface tension and thus possible to suppress the collapse of the uneven pattern.

Finally, the first transfer unit 31 carries the substrate W out of the drying device 33 (S8). The first transfer unit 31 transfers the substrate W to the transit device 24. Thereafter, the second transfer unit 22 takes the substrate W out of the transit device 24 and then transfers the substrate W into the carrier C.

Figure 5A:
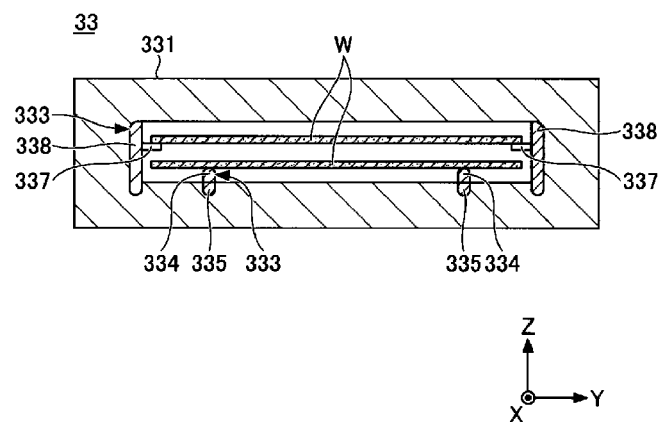
FIG. 5A is a cross-sectional view of a drying device according to the exemplary embodiment.
Figure 5B:
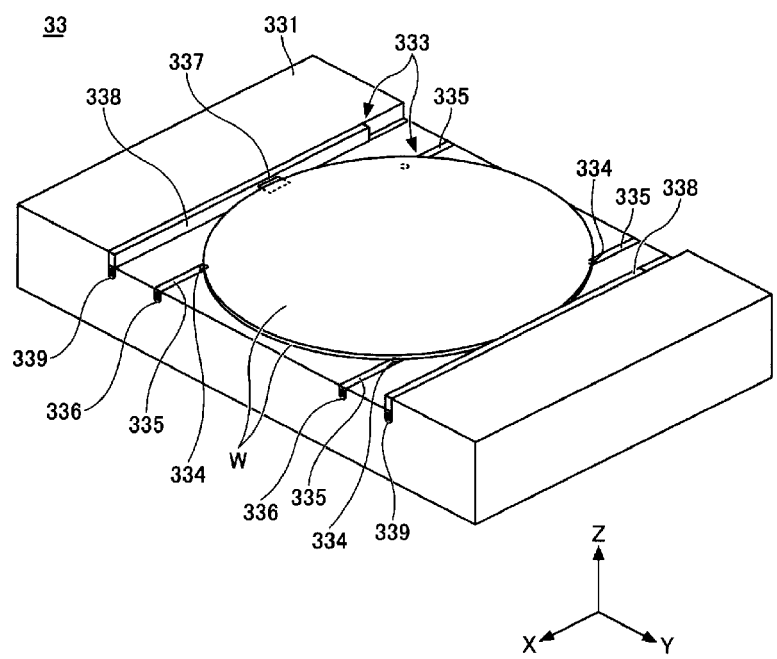
FIG. 5B is a perspective view showing an internal structure of the drying device shown in FIG. 5A.

Hereinafter, the drying device 33 will be described with reference to FIG. 5A and FIG. 5B. The drying device 33 is equipped with the processing container 331 that accommodates therein the substrate W. The processing container 331 includes, for example, a bottom wall, a top wall and a pair of side walls, as shown in FIG. 5A. The drying device 33 is equipped with a support 333 configured to support the substrate W inside the processing container 331.

For example, the support 333 is fixed to the inside of the processing container 331, but does not need to move back and forth between the inside and the outside of the processing container 331 through an opening of the processing container 331 as described in Patent Document 1. An area for delivering the substrate W between the support 333 and the first transfer unit 31 does not need to be provided outside the processing container 331 as described in Patent Document 1. Therefore, it is possible to miniaturize the drying device 33.

If the support 333 is fixed to the inside of the processing container 331, any backlash does not occur between sliding members unlike a case where the support 333 moves back and forth as described in Patent Document 1. As a result, it is possible to suppress the vibration of the support 333 and thus possible to suppress the vibration of the substrate W. Therefore, it is possible to suppress the overflow and fall of the drying liquid from the substrate W.

The support 333 simultaneously supports a plurality of substrates W. Since the plurality of substrates W can be dried simultaneously in the drying device 33, it is possible to improve the productivity of the substrate processing apparatus 1. Also, it is possible to reduce the number of drying devices 33 and thus possible to reduce the cost. When the drying device 33 dries the substrate W with the supercritical fluid, it is possible to remarkably reduce the cost. This is because the supercritical fluid has a high pressure, and, thus, the components of the processing container 331 require pressure resistance.

For example, the support 333 horizontally supports each of a plurality of (for example, two) substrates W arranged at the intervals in the vertical direction. The support 333 includes a plurality of pins 334 configured to support a lower substrate W from the bottom, and a plurality of beams 335 configured to support the plurality of pins 334 from the bottom. Each beam 335 extends in the X-axis direction, and each pin 334 is provided at one end of the beam 335. The beams 335 are inserted into grooves in the bottom wall of the processing container 331. The beams 335 are fixed to the processing container 331 by screws 336 or the like, as shown in FIG. 5B.

Also, the support 333 includes a plurality of horizontal plates 337 configured to support an upper substrate W from the bottom, and a plurality of beams 338 configured to support the plurality of horizontal plates 337 from the side. Each beam 338 extends in the X-axis direction, and each horizontal plate 337 is provided in the middle of the beam 338. The beams 338 are inserted into grooves in the bottom wall of the processing container 331, and are in contact with the side walls of the processing container 331. The beams 333 are fixed to the processing container 331 by screws 339 or the like, as shown in FIG. 5B.

Then, referring to FIG. 1 again, the positional relationship between the liquid processing device 32 and the drying device 33 will be described. As for each drying device 33, a plurality of liquid processing devices 32 configured to process substrates W to be simultaneously carried into the drying device 33 is grouped. Each group G1, G2 has, for example, an L-shape, and includes a plurality of liquid processing devices 32 and a single drying device 33.

In each group G1, G2, a plurality of liquid processing devices 32 is arranged symmetrically with respect to the transfer path 311 and the drying device 33 is adjacent to one of the liquid processing devices 32. Also, the drying device 33 from the group G1 and the drying device 33 from the group G2 are arranged symmetrically with respect to the transfer path 311. With this arrangement, the substrates W can be transferred at the same time in the plurality of groups G1 and G2.

Figure 3:
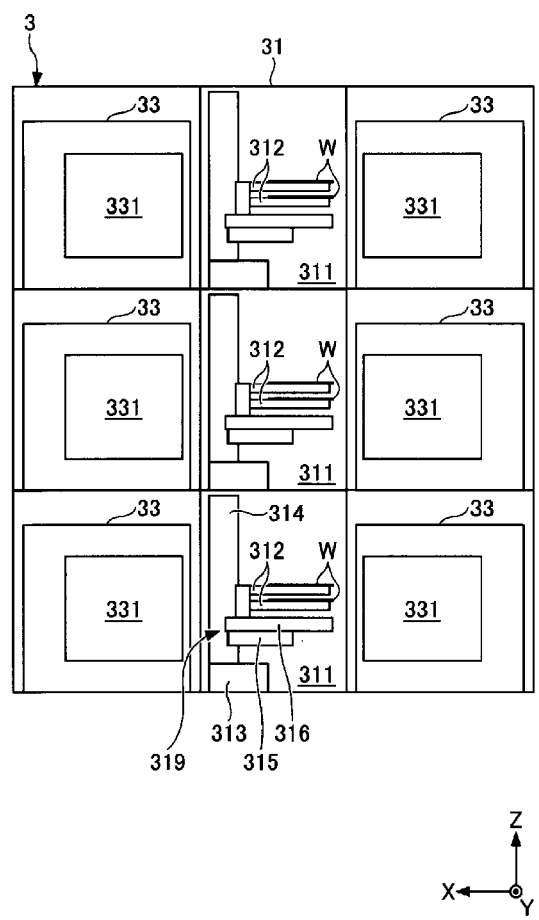
FIG. 3 is a side view of the substrate processing apparatus according to the exemplary embodiment.

For example, the first transfer unit 31 is equipped with a moving base 313 configured to move in the Y-axis direction along the transfer path 311, as shown in FIG. 3. When the single moving base 313 moves in the Y-axis direction, a plurality of supports 312 simultaneously moves in the Y-axis direction. An elevating mechanism 314, a rotating mechanism 315 and a moving mechanism 316 are provided on the moving base 313.

The elevating mechanism 314 is configured to simultaneously elevate the plurality of supports 312. For example, the elevating mechanism 314 elevates the rotating mechanism 315, and thus simultaneously elevates the moving mechanism 316 and the plurality of supports 312.

The rotating mechanism 315 is configured to rotate the plurality of supports 312 around a vertical axis. For example, the rotating mechanism 315 rotates the moving mechanism 316, and thus simultaneously rotates the plurality of supports 312.

The moving mechanism 316 is configured to move the plurality of supports 312 individually in the horizontal direction (for example, the X-axis direction). If a rotation angle of the moving mechanism 316 is changed by the rotating mechanism 315, it is also possible to move the plurality of supports 312 individually in the Y-axis direction.

A transfer mechanism 319 is composed of the plurality of supports 312, the moving base 313, the elevating mechanism 314, the rotating mechanism 315 and the moving mechanism 316. The transfer mechanism 319 moves along the transfer path 311 and transfers the substrate W between the devices adjacent to the transfer path 311.

Hereinafter, operations of the substrate processing apparatus 1 according to the exemplary embodiment will be described with reference to FIG. 6A to FIG. 6I. In FIG. 6A to FIG. 6I, a substrate W with a dotted pattern refers to a substrate W on which the drying liquid is accumulated, and a substrate W with a diagonal stripe pattern refers to a substrate W on which the drying has been completed. The dotted pattern and the stripe pattern in FIG. 10A to FIG. 13G and FIG. 15A to FIG. 15F mean the same as in FIG. 6A to FIG. 6I. Hereinafter, a processing onto a substrate W by the group G1 will be described. The same processing is performed onto a substrate W by the group G2, and, thus, illustration and description thereof will be omitted.

Figure 6A:
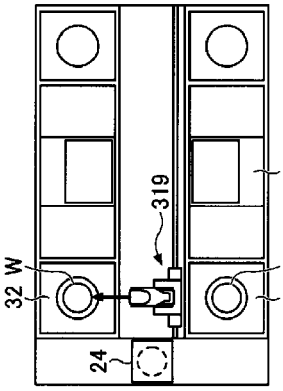
FIG. 6A to FIG. 6I show plan views illustrating operations of the substrate processing apparatus according to the exemplary embodiment.
Figure 6B:
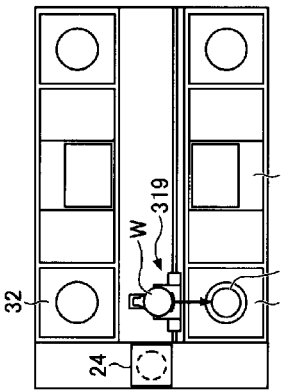
Figure 6C:
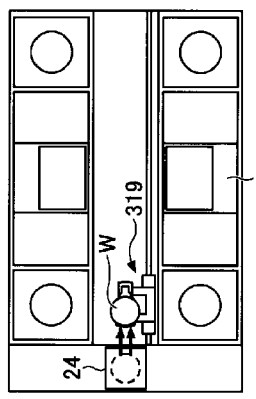

As shown in FIG. 6A to FIG. 6C, the transfer mechanism 319 simultaneously takes a plurality of substrates W, which will be simultaneously carried into the same drying device 33, out of the transit device 24 and sequentially carries the plurality of substrates W into a plurality of liquid processing devices 32. Also, the transfer mechanism 319 may take a single substrate W out of the transit device 24 and carry it into the liquid processing device 32 in a repeated manner.

Figure 6D:
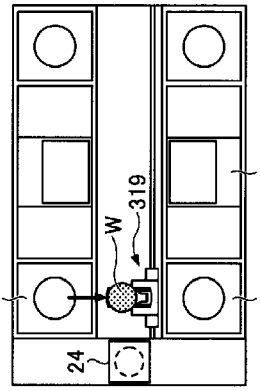

Then, as shown in FIG. 6D, the plurality of liquid processing devices 32 may simultaneously complete the accumulation of the drying liquid on the plurality of substrates W, which will be simultaneously carried into the same drying device 33. Natural drying is started as soon as the liquid accumulation is completed. If the liquid accumulation is completed simultaneously, it takes the same time for the plurality of substrates W to be carried into the drying device 33 after the completion of the liquid accumulation, which results in the same amount of the natural drying on the plurality of substrates W. Therefore, when the plurality of substrates W is carried into the drying device 33, the same amount of the drying liquid remains on the plurality of substrates W. This is effective particularly if the drying liquid is highly volatile, for example, if the drying liquid is IPA.

The plurality of liquid processing devices 32 may simultaneously start the accumulation of the drying liquid on the plurality of substrates W, which will be simultaneously carried into the same drying device 33. It takes the same time for the plurality of liquid processing devices 32 to accumulate the drying liquid. Therefore, if the accumulation of the drying liquid is started simultaneously, the accumulation of the drying liquid can be completed simultaneously. A supply timing of the chemical liquid is not limited particularly, but desirably the chemical liquid is supplied simultaneously. The supply of the chemical liquid is started simultaneously as soon as the substrates W are completely carried into the plurality of liquid processing devices 32.

Figure 6E:
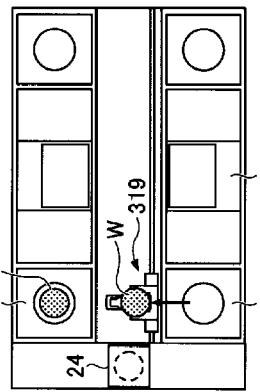
Figure 6F:
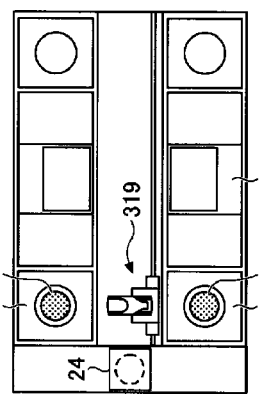
Figure 6G:
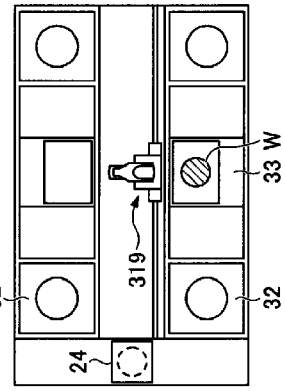

Thereafter, as shown in FIG. 6E and FIG. 6F, the transfer mechanism 319 sequentially carries the plurality of substrates W out of the plurality of liquid processing devices 32. Then, as shown in FIG. 6G, the transfer mechanism 319 transfers the plurality of substrates W toward the drying device 33 in a state where the drying liquid is accumulated on each of the substrates W.

Figure 6H:
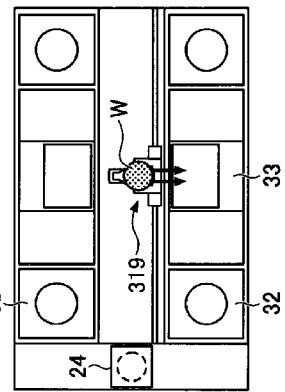
Figure 6I:
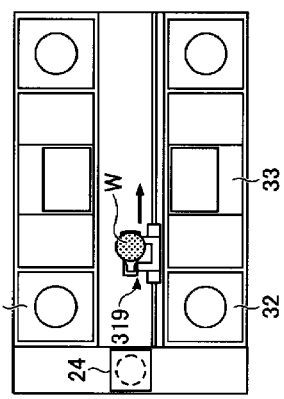

Subsequently, as shown in FIG. 6H, the transfer mechanism 319 simultaneously carries the plurality of substrates W, which has been processed in the plurality of liquid processing devices 32, into the same drying device 33. Then, as shown in FIG. 6I, the drying device 33 dries each substrate W by replacing the drying liquid accumulated on each of the substrates W with the supercritical fluid. The drying device 33 simultaneously dries the plurality of substrates W.

Thereafter, although not illustrated in the drawings, the transfer mechanism 319 simultaneously carries the plurality of substrates W out of the drying device 33 and simultaneously carries the plurality of substrates W into the transit device 24. Subsequently, the second transfer unit 22 simultaneously or sequentially carries the plurality of substrates W out of the transit device 24 and then simultaneously or sequentially transfers the plurality of substrates W into the carrier C.

In the present exemplary embodiment, the liquid processing device 32 corresponds to a first substrate processing device described in Claims, and the drying device 33 corresponds to a second substrate processing device described in Claims. Also, the first substrate processing device is not limited particularly as long as it can process substrates W one by one. Further, the second substrate processing device is not limited particularly as long as it can simultaneously process the plurality of substrates W, which has been processed by the plurality of first substrate processing devices. The second substrate processing device may be an inspection device configured to measure a weight of the drying liquid accumulated on the substrate W before the substrate W is dried by the drying device 33. Alternatively, the second substrate processing device may be a cleaning device configured to irradiate a substrate W with ultraviolet light and remove an organic substance adhering to the substrate W after the substrate W is dried by the drying device 33. The drying device 33 is not limited to a supercritical drying device, but may be, for example, a vacuum drying device. These apply equally to the following first to fifth modification examples.

Figure 7:
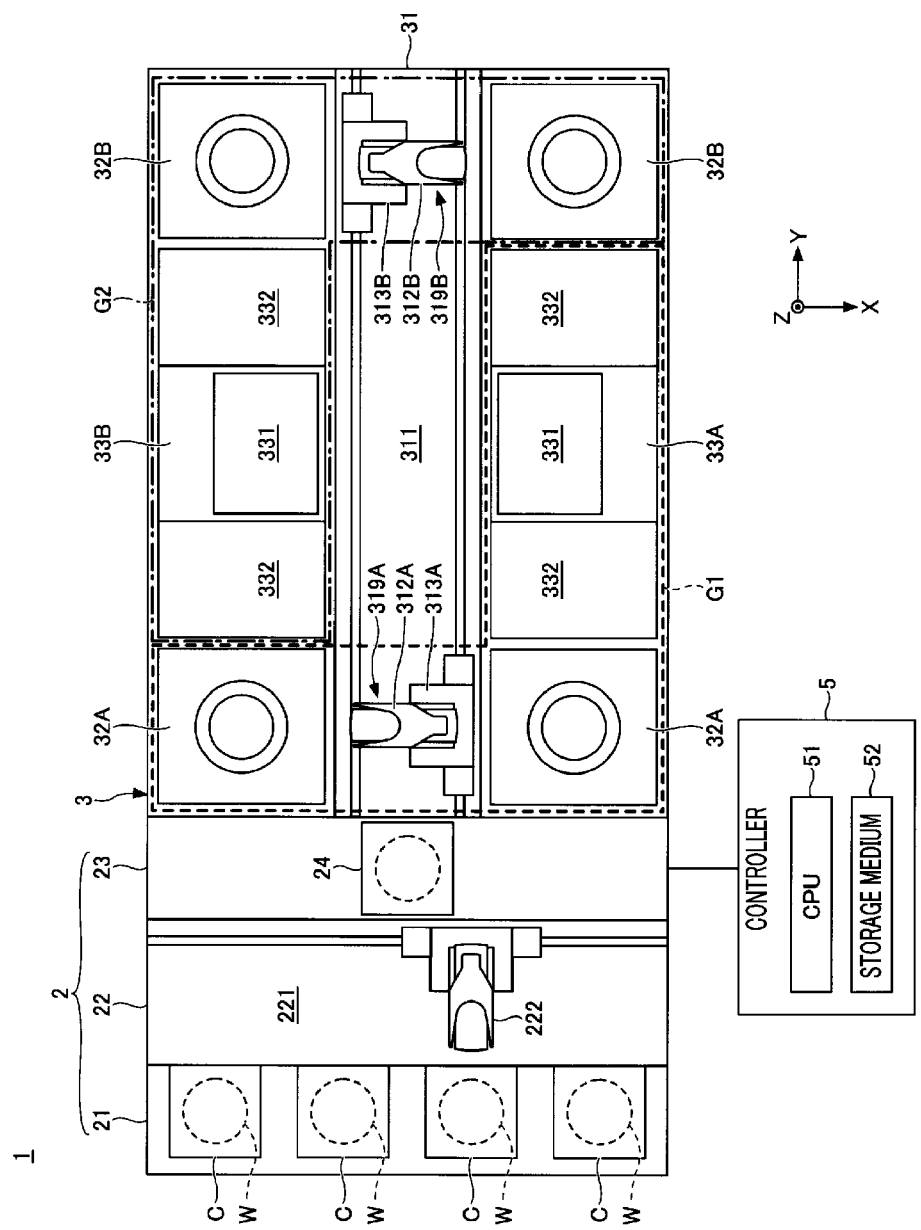
FIG. 7 is a plan view of the substrate processing apparatus according to a first modification example.

Hereinafter, the substrate processing apparatus 1 according to a first modification example will be described with reference to FIG. 7 to FIG. 9B. Hereinafter, differences between the first modification example and the above-described exemplary embodiment will be described mainly. As shown in FIG. 7, the first transfer unit 31 is equipped with a plurality of moving bases 313A and 313B that individually move along the single transfer path 311.

Figure 9A:
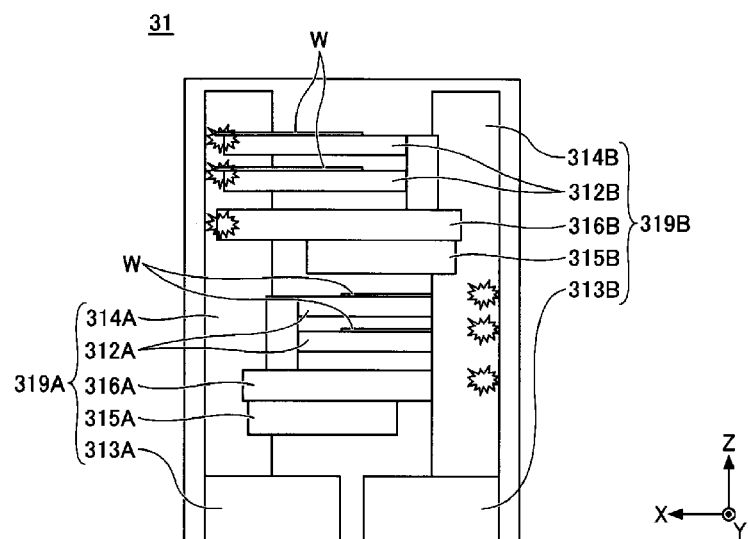
FIG. 9A is a side view of FIG. 8A.
Figure 9B:
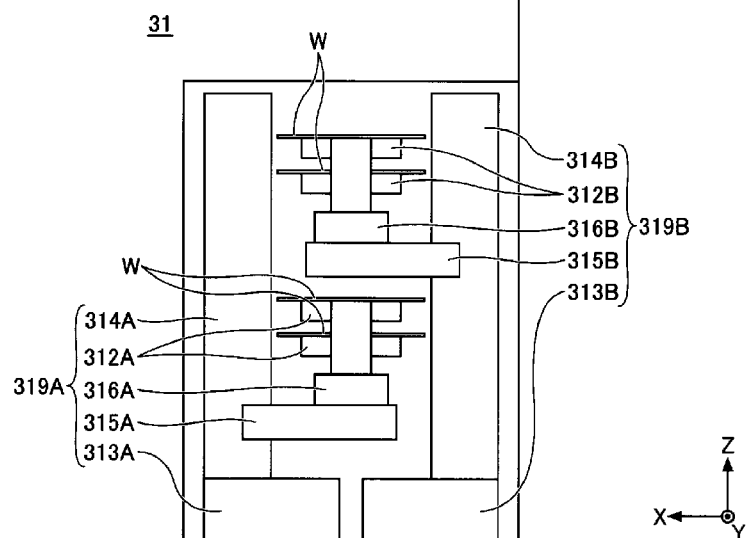
FIG. 9B is a side view of FIG. 8B.

As shown in FIG. 9A and FIG. 9B, an elevating mechanism 314A, a rotating mechanism 315A and a moving mechanism 316A are provided on the moving base 313A as in the above-described exemplary embodiment. A first transfer mechanism 319A is composed of a plurality of supports 312A, the moving base 313A, the elevating mechanism 314A, the rotating mechanism 315A and the moving mechanism 316A.

The first transfer mechanism 319A moves along the transfer path 311 and transfers the substrate W between the devices adjacent to the transfer path 311. The first transfer mechanism 319A transfers the substrate W among the transit device 24, a plurality of liquid processing devices 32A and a drying device 33A. The plurality of liquid processing devices 32A and the drying device 33A form an L-shaped group G1 when viewed from the top.

Likewise, an elevating mechanism 314B, a rotating mechanism 315B and a moving mechanism 316B are provided on the moving base 313B. A second transfer mechanism 319B is composed of a plurality of supports 312B, the moving base 313B, the elevating mechanism 314B, the rotating mechanism 315B and the moving mechanism 316B.

The second transfer mechanism 319B moves along the transfer path 311 independently of the first transfer mechanism 319A and transfers the substrate W between a plurality of devices adjacent to the transfer path 311. The second transfer mechanism 319B transfers the substrate W among the transit device 24, a plurality of liquid processing devices 32B and a drying device 33B. The plurality of liquid processing devices 32B and the drying device 33B form an L-shaped group G2 when viewed from the top.

Figure 8A:
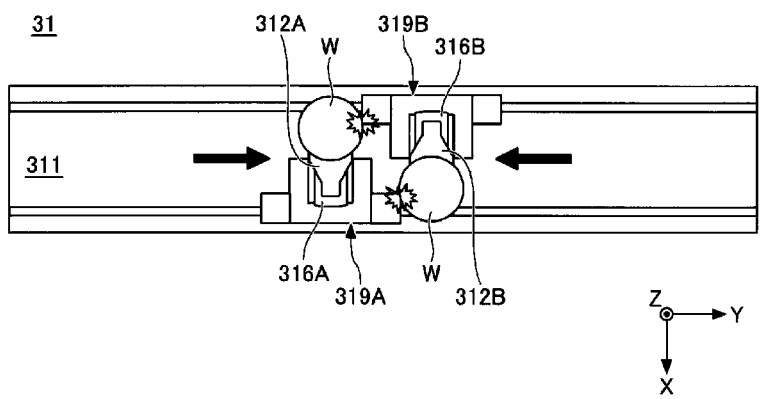
FIG. 8A is a plan view illustrating a collision between a first transfer mechanism and a second transfer mechanism according to the first modification example.

The first transfer mechanism 319A and the second transfer mechanism 319B move along the same transfer path 311. For this reason, as shown in FIG. 8A and FIG. 9A, the substrate W supported on the first transfer mechanism 319A or the first transfer mechanism 319A may collide with the substrate W supported on the second transfer mechanism 319B or the second transfer mechanism 319B.

Figure 8B:
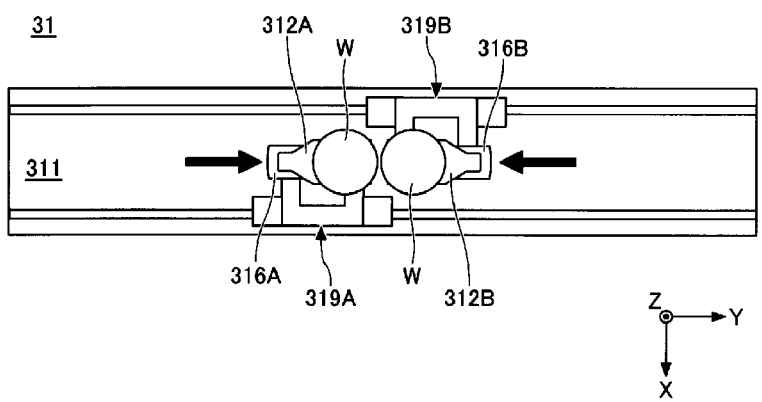
FIG. 8B is a plan view illustrating that the first transfer mechanism and the second transfer mechanism pass each other.

Therefore, as shown in FIG. 8B, the rotating mechanisms 315A and 315B may rotate the moving mechanisms 316A and 316B by 90° so that the longitudinal direction of the moving mechanisms 316A and 316B is set to the Y-axis direction when viewed from the top. As clearly seen from FIG. 9B, the first transfer mechanism 319A and the second transfer mechanism 319B may pass each other.

When the first transfer mechanism 319A and the second transfer mechanism 319B pass each other, the supports 312A, the rotating mechanism 315A and the moving mechanism 316A are located under the supports 312B, the rotating mechanism 315B and the moving mechanism 316B, but may be located above them.

Hereinafter, operations of the substrate processing apparatus 1 according to the first modification example will be described with reference to FIG. 10A to FIG. 12C. Since FIG. 10A to FIG. 10F are the same as FIG. 6A to FIG. 6F, respectively, description thereof will be provided briefly.

As shown in FIG. 10A to FIG. 10C, the first transfer mechanism 319A takes a plurality of substrates W out of the transit device 24 and then sequentially transfers the plurality of substrates W into the plurality of liquid processing devices 32A. Then, as shown in FIG. 10D, the plurality of liquid processing devices 32A may simultaneously start and simultaneously complete the accumulation of the drying liquid on the substrates W. Thereafter, as shown in FIG. 10E and FIG. 10F, the first transfer mechanism 319A sequentially carries the plurality of substrates W out of the plurality of liquid processing devices 32A.

Subsequently, as shown in FIG. 10G, the first transfer mechanism 319A moves toward the drying device 33A in a state where the drying liquid is accumulated on each of the substrates W. While the first transfer mechanism 319A moves toward the drying device 33A in a positive Y-axis direction, the second transfer mechanism 319B moves toward the transit device 24 in a negative Y-axis direction. The longitudinal direction of the moving mechanisms 316A and 316B is set to the Y-axis direction so that the first transfer mechanism 319A and the second transfer mechanism 319B pass each other during the movement.

Figure 11A:
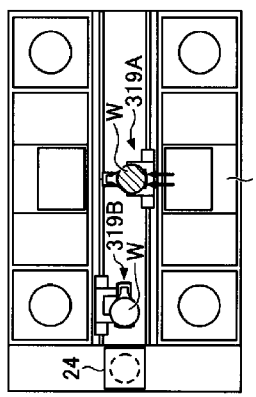
FIG. 11A to FIG. 11I show plan views illustrating operations of the substrate processing apparatus according to the first modification example subsequent to FIG. 10A to FIG. 10I, and FIG. 11A to FIG. 11I are plan views sequentially illustrating a plurality of processes.

Then, as shown in FIG. 10H, the first transfer mechanism 319A simultaneously carries the plurality of substrates W into the same drying device 33A. Thereafter, as shown in FIG. 10I, the drying device 33A simultaneously dries the plurality of substrates W. Subsequently, as shown in FIG. 11A, the first transfer mechanism 319A simultaneously carries the plurality of substrates W out of the drying device 33A. In the meantime, the second transfer mechanism 319B takes the plurality of substrates W out of the transit device 24, as shown in FIG. 10H.

Figure 11B:
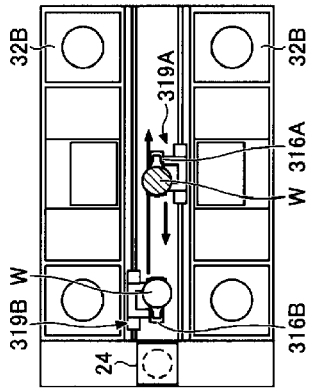

Then, as shown in FIG. 11B, the first transfer mechanism 319A moves toward the transit device 24. While the first transfer mechanism 319A moves toward the transit device 24 in the negative Y-axis direction, the second transfer mechanism 319B moves toward the liquid processing devices 32B in the positive Y-axis direction. The longitudinal direction of the moving mechanisms 316A and 316B is set to the Y-axis direction so that the first transfer mechanism 319A and the second transfer mechanism 319B pass each other during the movement.

Figure 11C:
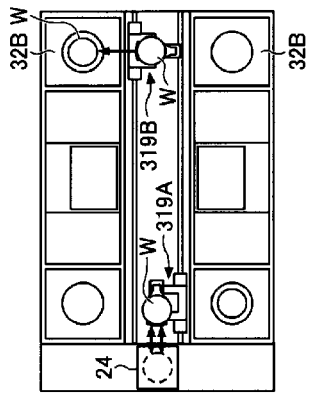
Figure 11D:
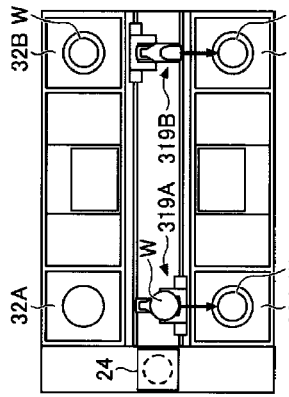
Figure 11E:
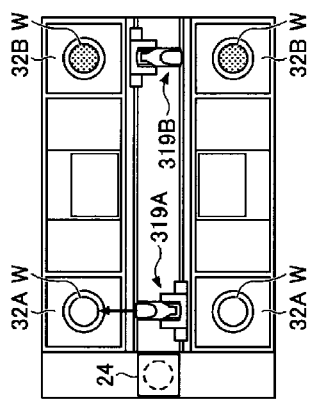

Thereafter, as shown in FIG. 11C and FIG. 11D, the second transfer mechanism 319B sequentially transfers the plurality of substrates W into the plurality of liquid processing devices 32B. Subsequently, as shown in FIG. 11E, the plurality of liquid processing devices 32B may simultaneously start and simultaneously complete the accumulation of the drying liquid on the substrates W.

In the meantime, the first transfer mechanism 319A delivers the plurality of processed substrates W to the transit device 24 and then takes a plurality of non-processed substrates W out of the transit device 24, as shown in FIG. 11C. Then, as shown in FIG. 11D and FIG. 11E, the first transfer mechanism 319A sequentially transfers the plurality of substrates W into the plurality of liquid processing devices 32A.

Figure 11F:
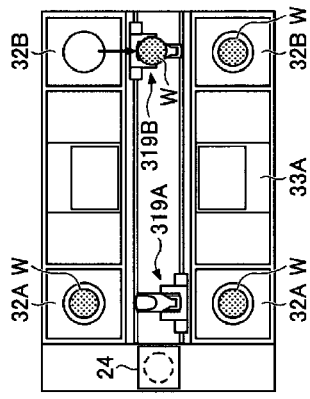
Figure 11G:
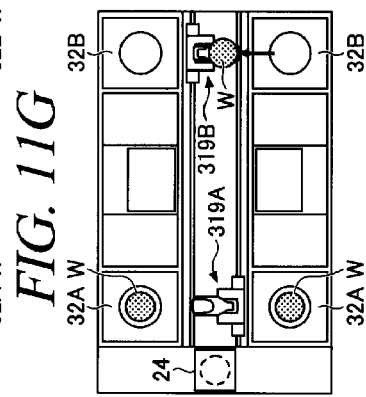
Figure 11H:
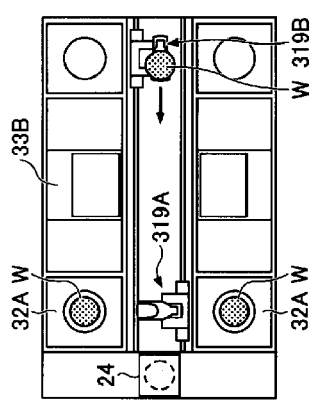
Figure 11I:
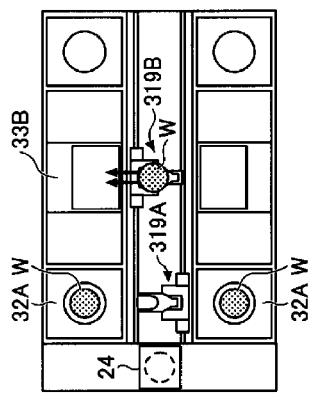

Thereafter, as shown in FIG. 11F and FIG. 11G, the second transfer mechanism 319B sequentially carries the plurality of substrates W out of the plurality of liquid processing devices 32B. Subsequently, as shown in FIG. 11H, the second transfer mechanism 319B moves toward the drying device 33B in a state where the drying liquid is accumulated on each of the substrates W. Then, as shown in FIG. 11I, the second transfer mechanism 319B simultaneously carries the plurality of substrates W into the same drying device 33B. Thereafter, as shown in FIG. 12A, the drying device 33B simultaneously dries the plurality of substrates W. Subsequently, as shown in FIG. 12B, the second transfer mechanism 319B simultaneously carries the plurality of substrates W out of the drying device 33B.

In the meantime, each of the plurality of liquid processing devices 32A supplies the processing liquid to the substrate W, as shown in FIG. 11F to FIG. 11I. The plurality of liquid processing devices 32A may simultaneously start and simultaneously complete the accumulation of the drying liquid on the substrates W. Thereafter, as shown in FIG. 12A and FIG. 12B, the first transfer mechanism 319A sequentially carries the plurality of substrates W out of the plurality of liquid processing devices 32A.

Subsequently, as shown in FIG. 12C, the first transfer mechanism 319A moves toward the drying device 33A in a state where the drying liquid is accumulated on each of the substrates W. While the first transfer mechanism 319A moves toward the drying device 33A in the positive Y-axis direction, the second transfer mechanism 319B moves toward the transit device 24 in the negative Y-axis direction. The longitudinal direction of the moving mechanisms 316A and 316B is set to the Y-axis direction so that the first transfer mechanism 319A and the second transfer mechanism 319B pass each other during the movement.

Then, the operations shown in FIG. 10H to FIG. 12C are performed repeatedly.

Figure 14A:
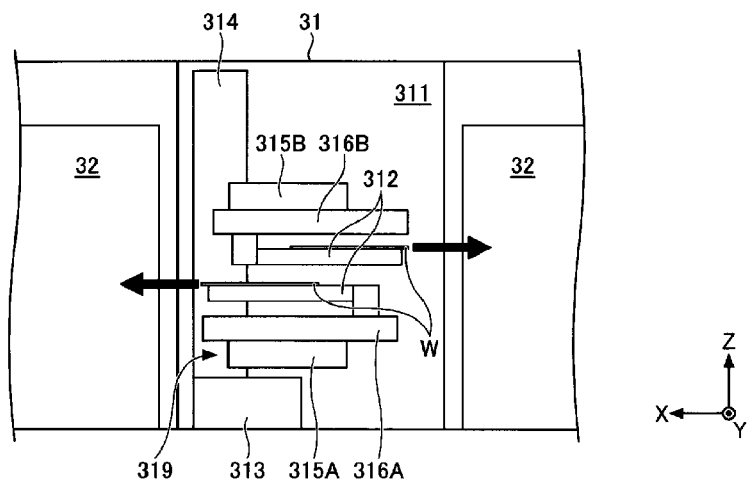
FIG. 14A is a side view of the process shown in FIG. 13B.
Figure 14B:
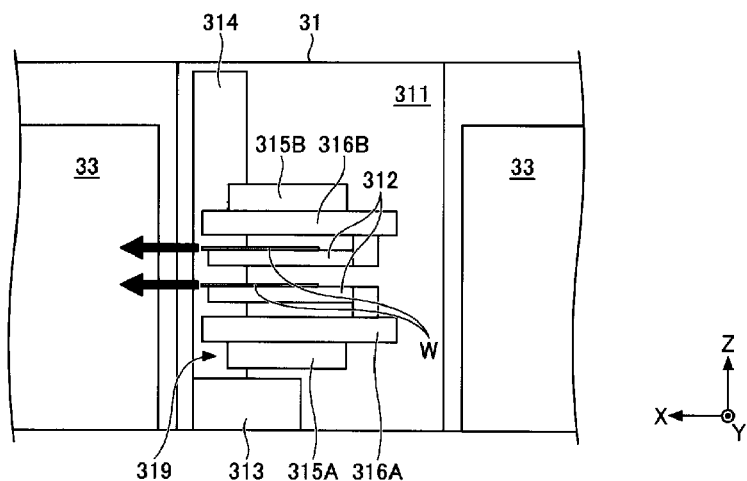
FIG. 14B is a side view of the process shown in FIG. 13F.

Hereinafter, operations of the substrate processing apparatus 1 and the first transfer unit 31 according to a second modification example will be described with reference to FIG. 13A to FIG. 13G and FIG. 14A and FIG. 14B. Hereinafter, differences between the second modification example and the above-described exemplary embodiment will be described mainly. For example, the first transfer unit 31 is equipped with the single moving base 313 moving along the transfer path 311 in the Y-axis direction, as shown in FIG. 14A and FIG. 14B.

Since the single moving base 313 moves in the Y-axis direction, the plurality of supports 312 simultaneously moves in the Y-axis direction. The elevating mechanism 314, the rotating mechanisms 315A and 315B and the moving mechanisms 316A and 316B are provided on the moving base 313.

The elevating mechanism 314 elevates the plurality of supports 312 individually. For example, since the elevating mechanism 314 elevates the rotating mechanisms 315A and 315B individually, the elevating mechanism 314 elevates the moving mechanisms 316A and 316B individually and elevates the plurality of supports 312 individually.

The rotating mechanisms 315A and 315B rotate the plurality of supports 312, respectively, around a vertical rotation axis. For example, since the rotating mechanisms 315A and 315B rotate the moving mechanisms 316A and 316B, respectively, the rotating mechanisms 315A and 315B rotate the plurality of supports 312 individually.

The moving mechanisms 316A and 316B move the plurality of supports 312 individually in the horizontal direction (for example, the X-axis direction). If rotation angles of the moving mechanisms 316A and 316B are regulated by the rotating mechanisms 315A and 315B, respectively, it is also possible to move the plurality of supports 312 individually in the Y-axis direction.

The transfer mechanism 319 is composed of the plurality of supports 312, the moving base 313, the elevating mechanism 314, the rotating mechanisms 315A and 315B and the moving mechanisms 316A and 316B. The transfer mechanism 319 moves along the transfer path 311 and transfers the substrate W between the devices adjacent to the transfer path 311.

Hereinafter, operations of the substrate processing apparatus 1 according to the second modification example will be described with reference to FIG. 13A to FIG. 13G. Hereinafter, a processing on the substrate W by the group G1 (see FIG. 1) will be described. The same processing is performed on the substrate W by the group G2, and, thus, illustration and description thereof will be omitted.

As shown in FIG. 13A and FIG. 13B, the transfer mechanism 319 simultaneously takes a plurality of substrates W, which will be simultaneously carried into the same drying device 33, out of the transit device 24 and simultaneously carries the plurality of substrates W into the plurality of liquid processing devices 32. As shown in FIG. 13B and FIG. 14A, the plurality of liquid processing devices 32 is arranged symmetrically with respect to the transfer path 311 and the plurality of supports 312 moves in opposite directions, and, thus, the plurality of substrates W is simultaneously carried into the plurality of liquid processing devices 32. In this case, the plurality of substrates W can be transferred into the plurality of liquid processing devices 32 in a shorter time, as compared with a case where the plurality of substrates W is sequentially carried into the plurality of liquid processing devices 32. If the plurality of substrates W is sequentially carried into the plurality of liquid processing devices 32, the supply of the chemical liquid onto the substrates W may be started simultaneously after the substrates W are completely carried into the plurality of liquid processing devices 32.

Then, as shown in FIG. 13C, the plurality of liquid processing devices 32 may simultaneously start and simultaneously complete the accumulation of the drying liquid on the plurality of substrates W. Thereafter, as shown in FIG. 13D, the transfer mechanism 319 simultaneously carries the plurality of substrates W out of the plurality of liquid processing devices 32. Subsequently, as shown in FIG. 13E, the transfer mechanism 319 moves the plurality of substrates W toward the drying device 33 in a state where the drying liquid is accumulated on each of the substrates W.

Then, as shown in FIG. 13F and FIG. 14B, the transfer mechanism 319 simultaneously carries the plurality of substrates W into the same drying device 33. Thereafter, as shown in FIG. 13G, the drying device 33 simultaneously dries the plurality of substrates W.

Subsequently, although not illustrated in the drawings, the transfer mechanism 319 simultaneously carries the plurality of substrates W out of the drying device 33 and simultaneously carries the plurality of substrates W into the transit device 24. Thereafter, the second transfer unit 22 simultaneously or sequentially carries the plurality of substrates W out of the transit device 24 and then simultaneously or sequentially transfers the plurality of substrates W into the carrier C.

Hereinafter, operations of the substrate processing apparatus 1 and the first transfer unit 31 according to a third modification example will be described with reference to FIG. 15A to FIG. 15F and FIG. 16A to FIG. 16C. Hereinafter, differences between the third modification example and the above-described exemplary embodiment will be described mainly. The first transfer unit 31 is, for example, a multi-joint robot as shown in FIG. 16A to FIG. 16C, and has a plurality of multi-joint arms 317. The support 312 is provided at a tip end of each of the multi-joint arms 317. Each support 312 is movable horizontally (in both the X-axis direction and the Y-axis direction) and vertically, and pivotable around a vertical axis by the multi-joint arm 317.

Figure 15A:
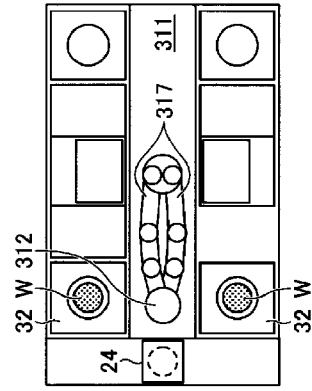
FIG. 15A to FIG. 15F show plan views illustrating operations of the substrate processing apparatus according to a third modification example.
Figure 15B:
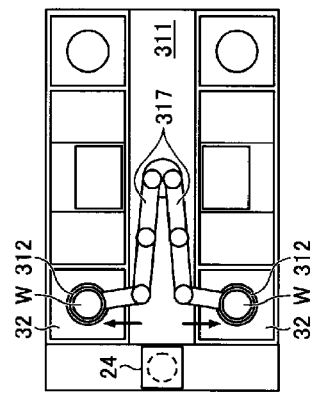
Figure 15C:
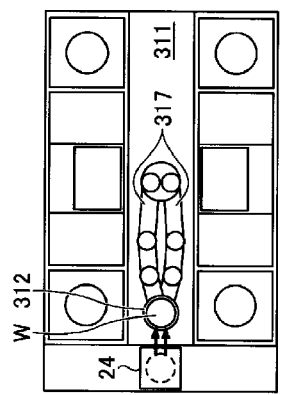
Figure 15D:
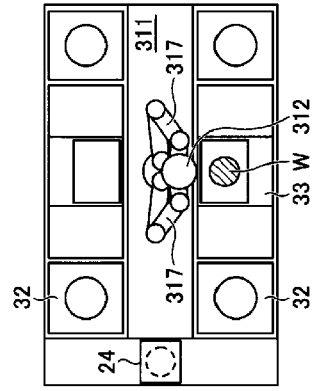
Figure 15E:
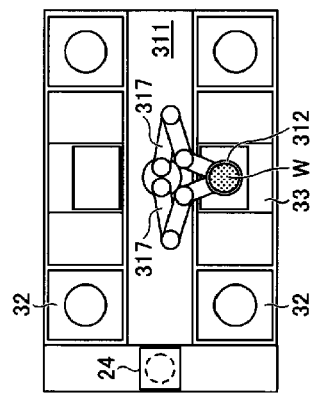
Figure 15F:
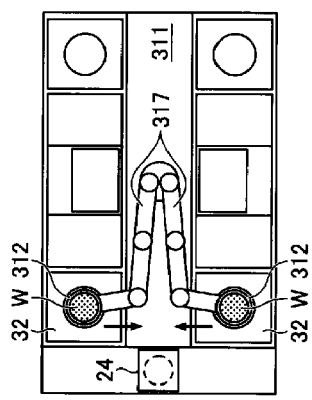
Figure 16A:
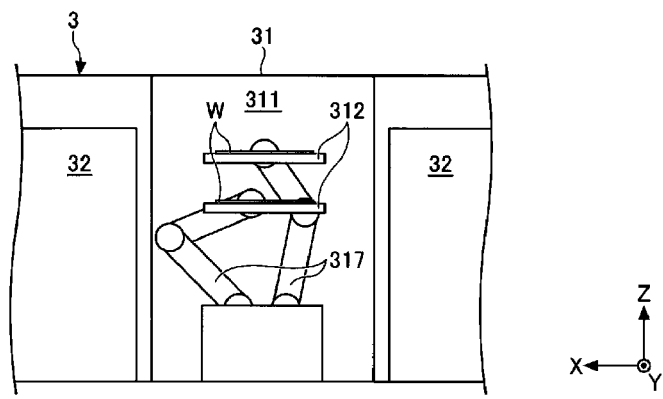
FIG. 16A is a side view of the process shown in FIG. 15A.
Figure 16B:
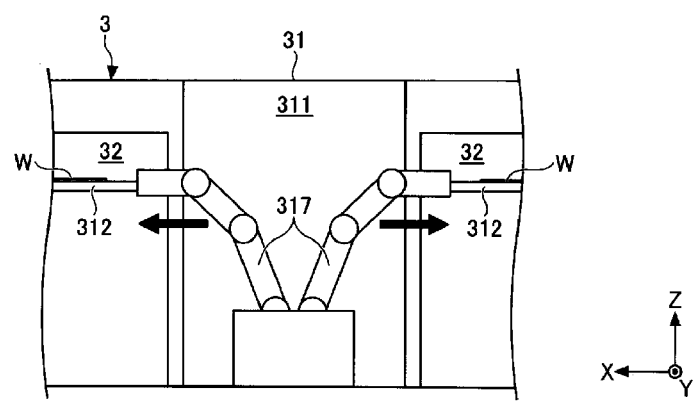
FIG. 16B is a side view of the process shown in FIG. 15B.
Figure 16C:
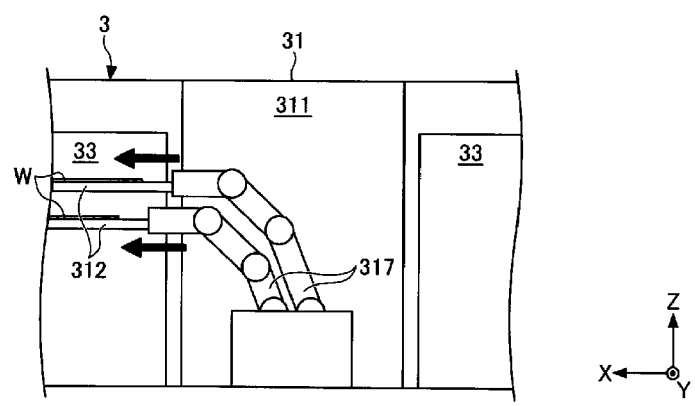
FIG. 16C is a side view of the process shown in FIG. 15E.

Since operations shown in FIG. 15A to FIG. 15F are the same as the operations shown in FIG. 13A to FIG. 13F, only main parts will be described. As shown in FIG. 15B and FIG. 16A, the plurality of liquid processing devices 32 is arranged symmetrically with respect to the transfer path 311 and the plurality of supports 312 moves in opposite directions, and, thus, the plurality of substrates W is simultaneously carried into the plurality of liquid processing devices 32. In this case, the plurality of substrates W can be transferred into the plurality of liquid processing devices 32 in a shorter time, as compared with a case where the plurality of substrates W is sequentially carried into the plurality of liquid processing devices 32.

Figure 17:
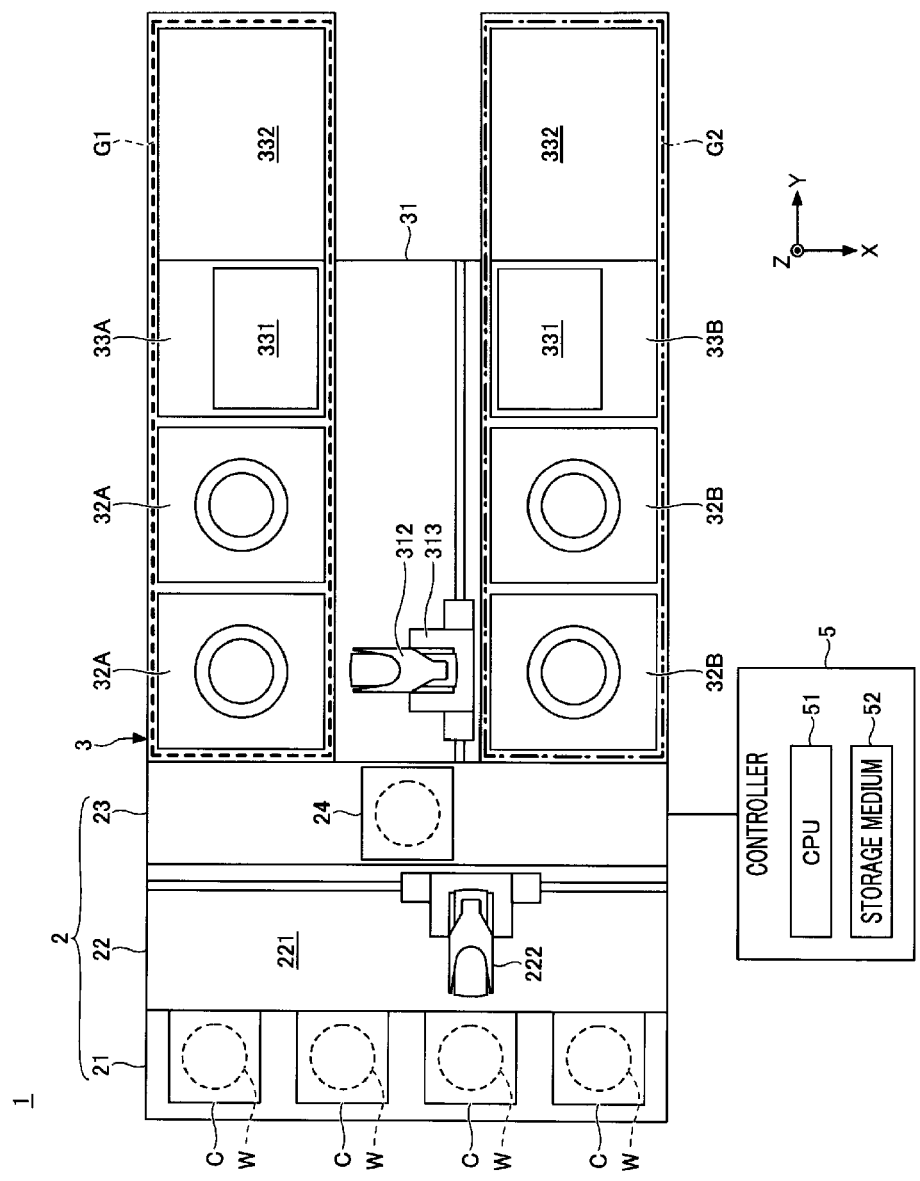
FIG. 17 is a plan view of the substrate processing apparatus according to a fourth modification example.

Hereinafter, the substrate processing apparatus 1 according to a fourth modification example will be described with reference to FIG. 17 and FIG. 18. Hereinafter, differences between the fourth modification example and the above-described exemplary embodiment will be described mainly. As shown in FIG. 17, the group G1 may be composed of the plurality of liquid processing devices 32A arranged on one side of transfer path 311 along the transfer path 311; and the drying device 33A. Likewise, the group G2 may be composed of the plurality of liquid processing devices 32B arranged on the other side of the transfer path 311 along the transfer path 311; and the drying device 33B. Hereinafter, a configuration of the group G1 will be described. The group G2 has the same configuration, and, thus, description thereof will be omitted.

The plurality of liquid processing devices 32A is arranged side by side on one side of the transfer path 311 along the transfer path 311 and provided adjacent to each other in the horizontal direction (the Y-axis direction). Also, the drying device 33A is provided adjacent to the liquid processing device 32A configured to process the substrate W, which will be carried into the drying device 33A. The drying device 33A is arranged farther from the transit device 24 than the plurality of liquid processing devices 32A. In this case, the processing container 331 of the drying device 33A just needs to be adjacent to the transfer path 311, and the supply mechanism 332 of the drying device 33A does not need to be adjacent to the transfer path 311. Since the supply mechanism 332 can be open to three directions (the positive X-axis direction, the negative X-axis direction and the positive Y-axis direction), the maintainability of the supply mechanism 332 can be improved. Also, since the transfer path 311 can be shortened, the transfer time for the substrate W can be reduced.

For example, the first transfer unit 31 is equipped with the single moving base 313 moving along the transfer path 311 in the Y-axis direction, as shown in FIG. 17. Since the single moving base 313 moves in the Y-axis direction, the plurality of supports 312 simultaneously moves in the Y-axis direction. The first transfer unit 31 sequentially carries the plurality of substrates W into the plurality of liquid processing devices 32A provided adjacent to each other in the horizontal direction (the Y-axis direction). At that time, the moving base 313 moves in the Y-axis direction.

Also, if the plurality of liquid processing devices 32 included in the same group G1 is arranged symmetrically with respect to the transfer path 311 as shown in FIG. 1, it is possible to skip the operation of moving the moving base 313 in the Y-axis direction when the plurality of substrates W is carried into the plurality of liquid processing devices 32.

Figure 18:
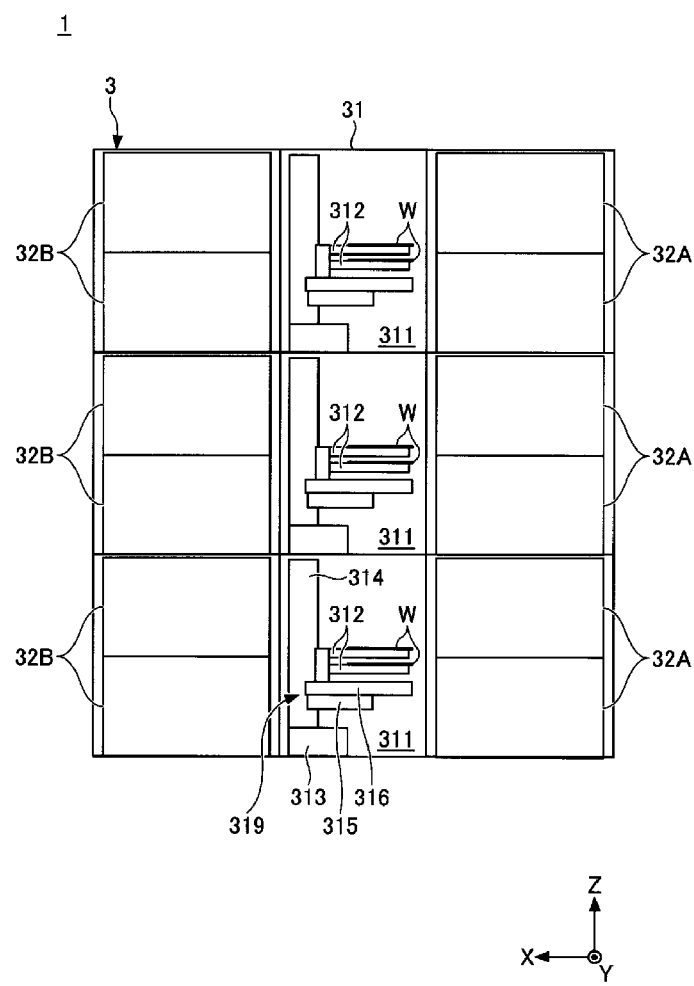
FIG. 18 is a side view of the substrate processing apparatus according to the fourth modification example.

As shown in FIG. 18, the plurality of liquid processing devices 32A may be stacked in the vertical direction on one side of the single transfer path 311. Likewise, the plurality of liquid processing devices 32B may be stacked in the vertical direction on the other side of the single transfer path 311. By increasing the number of liquid processing devices, the productivity of the substrate processing apparatus 1 can be improved.

Although not shown in the drawings, a plurality of drying devices 33A may be stacked in the vertical direction on one side of the single transfer path 311. Likewise, a plurality of drying devices 33B may be stacked in the vertical direction on the other side of the single transfer path 311. By increasing the number of drying devices, the productivity of the substrate processing apparatus 1 can be improved.

Also, the first transfer unit 31 may take the plurality of substrates W, on which the drying liquid is accumulated, out of the plurality of liquid processing devices 32A stacked in the vertical direction and simultaneously carry the plurality of substrates W into the drying device 33A, instead of taking the plurality of substrates W out of the plurality of liquid processing devices 32A arranged in the horizontal direction and simultaneously carrying the plurality of substrates W into the drying device 33A. Likewise, the first transfer unit 31 may take a plurality of substrates W, on which the drying liquid is accumulated, out of the plurality of liquid processing devices 32B stacked in the vertical direction and simultaneously carry the plurality of substrates W into the drying device 33B, instead of taking the plurality of substrates W out of the plurality of liquid processing devices 32B arranged in the horizontal direction and simultaneously carrying the plurality of substrates W into the drying device 33B.

Figure 19:
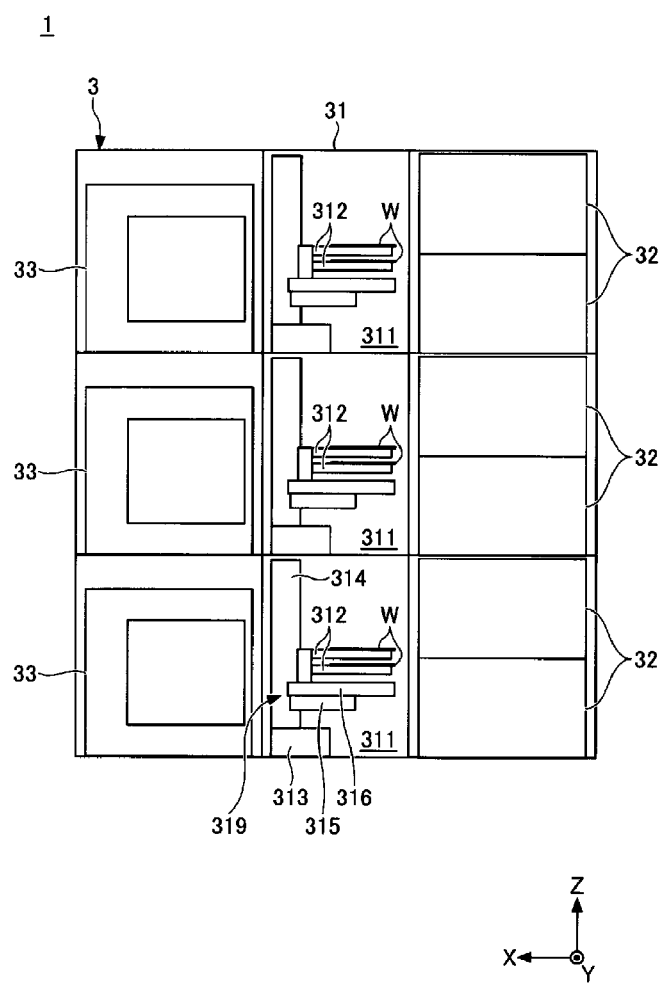
FIG. 19 is a side view of the substrate processing apparatus according to a fifth modification example.

Hereinafter, the substrate processing apparatus 1 according to a fifth modification example will be described with reference to FIG. 19. Hereinafter, differences between the fifth modification example and the above-described exemplary embodiment will be described mainly. As shown in FIG. 19, the plurality of liquid processing devices 32 configured to process a plurality of substrates W, which will be simultaneously carried into the same drying device 33, is stacked in the vertical direction on one side of the single transfer path 311. Further, the drying device 33 is opposite to the liquid processing devices 32 configured to process the substrates W, which will be simultaneously carried into the drying device 33, with the single transfer path 311 therebetween. In this case, the moving base 313 may not be moved in the Y-axis direction, the plurality of substrates W may be carried into and carried out of the plurality of liquid processing devices 32 and the plurality of substrates W may be carried into the drying device 33.

Figure 20:
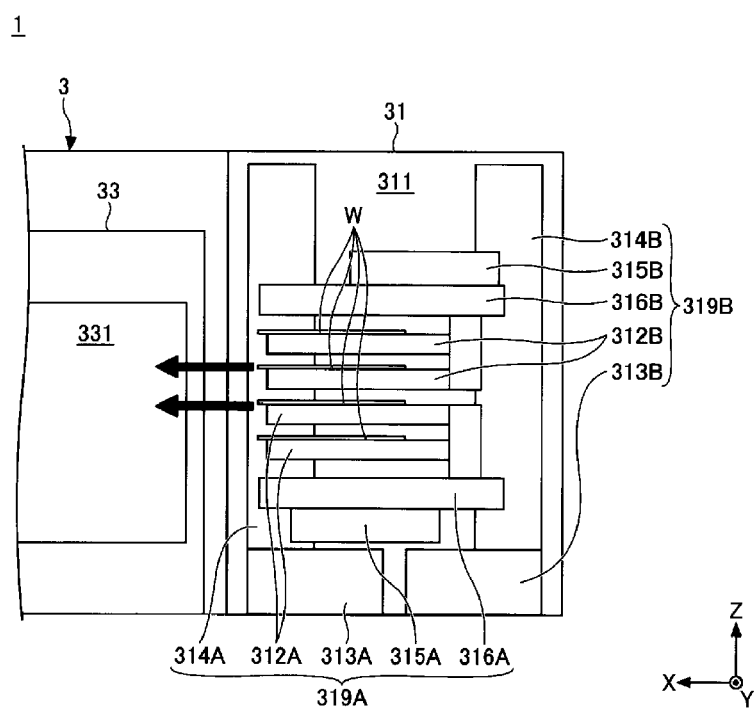
FIG. 20 is a side view illustrating a modification example of a transfer unit.

Hereinafter, a modification example of the first transfer unit 31 will be described with reference to FIG. 20. The first transfer unit 31 according to the present modification example has the first transfer mechanism 319A and the second transfer mechanism 319B like the first transfer unit 31 according to the first modification example. However, the first transfer mechanism 319A and the second transfer mechanism 319B simultaneously carry a plurality of substrates W into the same drying device 33. At that time, the supports 312B of the second transfer mechanism 319B may be located above the supports 312A of the first transfer mechanism 319A.

In the first transfer mechanism 319A, the rotating mechanism 315A, the moving mechanism 316A and the plurality of supports 312A are arranged in this order from bottom to top. The first transfer mechanism 319A carries the substrate W, which is supported by the upper support 312A, into the drying device 33.

Meanwhile, in the second transfer mechanism 319B, the rotating mechanism 315B, the moving mechanism 316B and the plurality of supports 312B are arranged in this order from top to bottom. The second transfer mechanism 319B carries the substrate W, which is supported by the lower support 312B, into the drying device 33.

Although the exemplary embodiments of the substrate processing apparatus and the substrate processing method have been described above, the present disclosure is not limited to the above-described exemplary embodiments. Various changes, modifications, substitutions, additions, deletions and combinations may be made within the scope of the claims. It should be understood that such changes, modifications, substitutions, additions, deletions and combinations belong to the technical scope of the present disclosure.

According to the present disclosure, it is possible to improve the productivity of the substrate processing apparatus in which the plurality of substrate processors sequentially processes the substrate.

From the foregoing, it will be appreciated that various exemplary embodiments of the present disclosure have been described herein for purposes of illustration and various changes can be made without departing from the scope and spirit of the present disclosure. Accordingly, various exemplary embodiments described herein are not intended to be limiting, and the true scope and spirit are indicated by the following claims.

We claim:

1. A substrate processing apparatus, comprising:
multiple first substrate processing devices each configured to process a substrate one by one, and perform accumulation of a processing liquid on the substrate;
one or more second substrate processing devices configured to simultaneously process multiple substrates, which are processed in the multiple first substrate processing devices;
a transfer unit comprising a moving base configured to move along a transfer path, and a plurality of supports provided on the moving base and configured to horizontally support and stack the multiple substrates thereon, the transfer unit configured to simultaneously carry the multiple substrates, which are processed in different first substrate processing devices, into a same second substrate processing device, in a state where the processing liquid is accumulated on the multiple substrates; and
a controller configured to control the first substrate processing devices, the one or more second substrate processing devices and the transfer unit,
wherein the processing liquid accumulated on the substrates includes an isopropyl alcohol,
the one or more second substrate processing devices are further configured to dry the substrates by replacing the processing liquid accumulated on the substrates with a supercritical fluid,
the controller is further configured to control the transfer unit to sequentially take the multiple substrates out of the multiple first substrate processing devices and to simultaneously carry the multiple substrates into the same second substrate processing device, and
the controller is further configured to control the multiple first substrate processing devices to simultaneously complete the accumulation of the processing liquid on the multiple substrates.

2. The substrate processing apparatus of claim 1, wherein the controller controls the multiple first substrate processing devices to simultaneously start the accumulation of the processing liquid on the multiple substrates, which are to be simultaneously carried into the same second substrate processing device.

3. The substrate processing apparatus of claim 1, wherein the transfer path of the transfer unit extends in a horizontal direction,
the multiple first substrate processing devices configured to process the multiple substrates, which are to be simultaneously carried into the same second substrate processing device, are arranged symmetrically with respect to the transfer path, and
the one or more second substrate processing devices are adjacent to one of the multiple first substrate processing devices configured to process the substrate, which is to be carried into the one or more second substrate processing devices.

4. The substrate processing apparatus of claim 3, wherein the one or more second substrate processing devices include multiple second substrate processing devices, and the multiple second substrate processing devices are arranged symmetrically with respect to the transfer path.

5. The substrate processing apparatus of claim 3, wherein the controller is configured to control the transfer unit to simultaneously carry the multiple substrates out of the multiple first substrate processing devices arranged symmetrically with respect to the transfer path and simultaneously carry the multiple substrates into the same second substrate processing device.

6. The substrate processing apparatus of claim 1, wherein the transfer path of the transfer unit extends in a horizontal direction,
the multiple first substrate processing devices configured to process the multiple substrates, which are to be simultaneously carried into the same second substrate processing device, are arranged side by side on one side of the transfer path along the transfer path and provided adjacent to each other in the horizontal direction, and
the one or more second substrate processing devices are adjacent to the multiple first substrate processing devices configured to process the substrates, which are to be carried into the one or more second substrate processing devices.

7. The substrate processing apparatus of claim 1, wherein the transfer path of the transfer unit extends in a horizontal direction,
the multiple first substrate processing devices configured to process the multiple substrates, which are to be simultaneously carried into the same second substrate processing device, are stacked in a vertical direction on one side of the transfer path, and
the one or more second substrate processing devices are adjacent to the multiple first substrate processing devices configured to process the substrates, which are to be simultaneously carried into the one or more second substrate processing devices.

8. The substrate processing apparatus of claim 1, wherein the transfer path of the transfer unit extends in a horizontal direction,
the multiple first substrate processing devices configured to process the multiple substrates, which are to be simultaneously carried into the same second substrate processing device, are stacked in a vertical direction on one side of the transfer path, and
the one or more second substrate processing devices are opposite to the multiple first substrate processing devices configured to process the substrates, which are to be simultaneously carried into the one or more second substrate processing devices, with the transfer path therebetween.

9. The substrate processing apparatus of claim 1, further comprising:

a carrier placing unit in which a carrier configured to accommodate therein the multiple substrates is placed;

a second transfer unit configured to take the substrate out of the carrier; and a delivery unit configured to receive the substrate delivered by the second transfer unit, wherein the controller is further configured to control the second transfer unit, wherein the controller controls the transfer unit to simultaneously take the multiple substrates, which are to be simultaneously carried into the same second substrate processing device, out of the delivery unit and transfer the multiple substrates into the multiple first substrate processing devices.

10. A substrate processing method, comprising:

processing a substrate one by one in each of multiple first substrate processing devices, each of the first substrate processing devices performing accumulation of a processing liquid on the substrate;

simultaneously carrying multiple substrates, which are processed in different first substrate processing devices, into a same second substrate processing device, in a state where the processing liquid is accumulated on the substrates, by a transfer unit comprising a moving base configured to move along a transfer path, and a plurality of supports provided on the moving base and configured to horizontally support and stack the multiple substrates thereon; and simultaneously processing the multiple substrates, which are processed in the multiple first substrate processing devices, in the same second substrate processing device, wherein the processing liquid accumulated on the substrates includes an isopropyl alcohol, the second substrate processing device is further configured to dry the substrates by replacing the processing liquid accumulated on the substrates with a supercritical fluid, the transfer unit sequentially takes the multiple substrates out of the multiple first substrate processing devices and simultaneously carries the multiple substrates into the same second substrate processing device, the multiple first substrate processing devices simultaneously complete the accumulation of the processing liquid on the multiple substrates.

* * * * *